United States Patent [19]
Smith et al.

[11] Patent Number: 5,458,086
[45] Date of Patent: Oct. 17, 1995

[54] APPARATUS FOR GROWING METAL OXIDES USING ORGANOMETALLIC VAPOR PHASE EPITAXY

[75] Inventors: Eric J. Smith; Steven P. DenBaars, both of Goleta; Boo J. L. Nilsson, Santa Barbara, all of Calif.

[73] Assignee: Superconductor Technologies, Inc., Santa Barbara, Calif.

[21] Appl. No.: 136,215

[22] Filed: Oct. 13, 1993

[51] Int. Cl.$^6$ ............................................. C30B 35/00
[52] U.S. Cl. ........................ 117/200; 117/84; 118/715
[58] Field of Search ........................ 117/84, 200, 209; 118/715, 719, 724; 505/1; 437/100

[56] References Cited

U.S. PATENT DOCUMENTS

| | | | |
|---|---|---|---|
| 4,855,254 | 8/1989 | Eshita et al. | 437/100 |
| 4,985,117 | 1/1991 | Kurosawa et al. | 156/659.1 |
| 5,047,390 | 9/1991 | Higashino et al. | 501/1 |
| 5,061,684 | 10/1991 | Freller et al. | 545/1 |
| 5,071,830 | 12/1991 | Olson et al. | 505/1 |
| 5,096,880 | 3/1992 | Rybka | 505/1 |
| 5,108,983 | 4/1992 | Lackey, Jr. et al. | 505/1 |
| 5,138,520 | 8/1992 | McMillan et al. | 361/311 |
| 5,141,917 | 8/1992 | Tanaka et al. | 501/1 |
| 5,157,015 | 10/1992 | Snyder et al. | 505/1 |
| 5,162,296 | 11/1992 | Yamazaki | 505/1 |
| 5,164,363 | 11/1992 | Eguchi et al. | 505/1 |
| 5,173,474 | 12/1992 | Connell et al. | 505/1 |
| 5,185,317 | 2/1993 | Wessels et al. | 505/1 |
| 5,198,412 | 3/1993 | Nagesh et al. | 505/1 |
| 5,204,314 | 4/1993 | Kirlin et al. | 505/1 |

FOREIGN PATENT DOCUMENTS

| | | |
|---|---|---|
| 89-258210/36 | 1/1988 | Japan . |
| 89-243029/34 | 2/1988 | Japan . |
| 89-235656/33 | 2/1988 | Japan . |
| 89-274633/38 | 2/1988 | Japan . |
| 90-033042/05 | 5/1988 | Japan . |
| 89-173830/24 | 8/1988 | Japan . |
| 90-119965/16 | 9/1988 | Japan . |
| 91-083145/12 | 6/1989 | Japan . |
| 1-162326 | 6/1989 | Japan . |
| 91-263987/36 | 12/1989 | Japan . |

OTHER PUBLICATIONS

Bednorz and Muller, *Possible High Tc Superconductivity in the Ba–La–Cu–O System* 64 Z. Phys. B–Condensed Matter 189 (1986).

Wu, et al., *Superconductivity at 93K in a New Mixed–Phase Y–Ba–Cu–O Compound System at Ambient Pressure* 58 Phys. Rev. Lett. 908 (1987).

Maeda, *A New High–Tc Oxide Superconductor Without a Rare Earth Element* 37 J. App. Phys. L209 (1988).

Chu, et al., *Superconductivity up to 114K in the Bi–Al–Ca–Br–Cu–O Compound System Without Rare Earth Elements* 60 Phys. Rev. Lett. 941 (1988).

Dijkkamp, et al., *Preparation of Y–Ba–Cu Oxide Superconductor Thin Films Using Pulsed Laser Evaporation Form High $T_c$ Bulk Material* 51 Appl. Phys. Lett. 619 (1987).

*Primary Examiner*—R. Bruce Breneman
*Assistant Examiner*—Felisa Garrett
*Attorney, Agent, or Firm*—Lyon & Lyon

[57] ABSTRACT

The methods and apparatus disclosed enable controlled growth of multicomponent metal oxide thin films, including high temperature superconducting (HTS) thin films, which are uniform and reproducible. The method and apparatus enable a controlled flow and pressure of a gaseous phase of metal containing molecules to be introduced into a reaction chamber, or into an analysis chamber, or into both. The flow into the reaction chamber enables deposition of metal oxides on a substrate and, therefore, growth of multicomponent metal oxide thin films, including HTS thin films, on the substrate. The flow into the analysis chamber enables compositional analysis of the gas. The apparatus also allows adjustment of the gaseous phase flow and pressure into the reaction chamber based upon the results of the compositional analysis. In one aspect of this invention, a heating mantle provides substantially uniform heating throughout the apparatus.

6 Claims, 2 Drawing Sheets

APPARATUS FOR GROWING METAL OXIDES USING ORGANOMETALLIC VAPOR PHASE EPITAXY

FIELD OF INVENTION

The present invention relates to growing metal oxide films, including multicomponent metal oxide films such as high temperature superconductors (HTSs). The present invention particularly relates to an improved method and apparatus for growing metal oxide and multicomponent metal oxide films using organometallic vapor phase epitaxy (OMVPE).

BACKGROUND

Metal oxides in general are compounds which contain both a metal and oxygen (e.g. MgO, $CeO_2$, $Y_2O_3$, and $ZrO_2$). Multicomponent metal oxides are those metal oxides which contain two or more different metals. Examples of multicomponent metal oxides include: HgBaCuO, YBaCuO, BiSrCaCuO, TlCaBaCuO, the perovskites $ABO_3$, where A and B include La, Sr, Al, Ta, Ti, etc...., (i.e. $LaAlO_3$, $SrTiO_3$, $BaTiO_3$, $CaZrO_3$, and $BaZrO_3$) and other compounds such as $MgAl_2O_4$, $SrAlTaO_6$, and $SrAlNbO_6$. Certain multicomponent metal oxides are superconducting and some are superconducting at high temperatures. Metal oxides and multicomponent metal oxides may be used as substrates on which superconducting films are grown.

Superconductivity refers to that state of metals and alloys in which the electrical resistivity is zero when the specimen is cooled to a sufficiently low temperature. The temperature at which a specimen undergoes a transition from a state of normal electrical resistivity to a state of superconductivity is known as the critical temperature ($T_c$).

Until recently, attaining the $T_c$ of known superconducting materials required the use of liquid helium and expensive cooling equipment. However, in 1986 a superconducting material having a $T_c$ of 30K was announced. See, e.g., Bednorz and Muller, Possible High Tc Superconductivity in the Ba-La-Cu-O System, 64 Z.Phys. B-Condensed Matter 189 (1986). Since that announcement superconducting materials having higher critical temperatures have been discovered. Currently, superconducting materials having critical temperatures in excess of the boiling point of liquid nitrogen, 77K at atmospheric pressure, have been disclosed.

Superconducting compounds consisting of combinations of alkaline earth metals and rare earth metals such as barium and yttrium in conjunction with copper (known as "YBCO superconductors") were found to exhibit superconductivity at temperatures above 77K. See, e.g., Wu, et al., Superconductivity at 93K in a New Mixed-Phase Y-Ba-Cu-O Compound System at Ambient Pressure, 58 Phys. Rev. Lett. 908 (1987). In addition, high temperature superconducting compounds containing bismuth have been disclosed. See, e.g., Maeda, A New High-Tc Oxide Superconductor Without a Rare Earth Element, 37 J. App. Phys. L209 (1988); and Chu, et al., Superconductivity up to 114K in the Bi-Al-Ca-Br-Cu-O Compound System Without Rare Earth Elements, 60 Phys. Rev. Lett. 941 (1988). Furthermore, superconducting compounds containing thallium have been discovered to have critical temperatures ranging from 90K to 123K (the highest critical temperatures to date). See, e.g., Koren, Gupta, and Baseman, 54 Appl. Phys. Lett. 1920 (1989). All of these superconducting compounds are multicomponent metal oxides.

These high temperature superconductors (HTSs) have been prepared in a number of forms. The earliest forms were preparation of bulk materials, which were sufficient to determine the existence of the superconducting state and phases. More recently, thin films on various substrates have been prepared which have proved to be useful for making practical superconducting devices. The substrate on which a thin film HTS is grown may be a metal oxide. In addition, both the thin film HTS and the substrate on which it is grown may be multicomponent metal oxides.

Several crystal growth techniques have been applied to the growth of high temperature superconducting compounds in thin film form. The most prominent of these have been pulsed laser deposition (PLD), off axis and on axis sputtering techniques, molecular beam epitaxy (MBE), and organometallic vapor phase epitaxy (OMVPE).

Pulsed laser deposition (PLD) was one of the first deposition techniques. See, e.g., Dijkkamp, et al., Preparation of Y-Ba-Cu Oxide Superconductor Thin Films Using Pulsed Laser Evaporation Form High $T_c$ Bulk Material, 51 Appl. Phys. Lett. 619 (1987). In addition, PLD was one of the most successful deposition techniques, particularly for the $YBa_2Cu_3$, $O_{7-\delta}$ high temperature superconducting compound. See, e.g., Hubler ed., Pulsed Laser Deposition, 17 MRS Bulletin, No. 2, 26 (1992). PLD has been used to produce very high quality films on up to two inch wafers, but users have not been able to eliminate film defects which result from laser beam interaction with target material. In addition, once a target is compounded with a particular composition, the only way to adjust the resulting film composition is to compound a new target.

Off axis and on axis sputtering techniques have also produced very good thin film superconductors on up to two inch wafers. See, e.g., Newman, et al., $YBa_2Cu_3O_{7-\delta}$ Superconducting Films with Low Microwave Surface Resistance Over Large Areas, 57 Appl. Phys. Lett. 520 (1990); and Poppe, et al., Low-Resistivity Epitaxial $YBa_2Cu_3O_7$ Thin Films With Improved Microstructure and Reduced Microwave Losses, 71 J. Appl. Phys. 5572 (1992). Sputtering is a relatively simple in situ growth technique which may be used to produce films with very few non-deposition related film defects. However, with on axis sputtering, as with PLD, the composition of the growing film can only be changed by compounding a new target. With off axis sputtering, where multiple targets may be available, no consistent active composition control has been demonstrated. Also, both on axis and off axis sputtering suffer from extremely low film deposition rates.

Molecular beam epitaxy (MBE) after several years of being used to produce films of only moderate quality, has recently been used to produce films that are among the best in the world. See, e.g., Humphreys, et al., Optimization of $YBa_2Cu_3O_7$ Thin Films for Multilayers, 27 IEEE Transactions On Magnetics 1357 (1991). Key to these improved results was the adoption of real time composition control of the growing films by utilization of mass spectroscopy. However, as with all MBE deposition processes, the use of high pressures of oxygen gas (HTS materials are all oxides) is difficult, and places severe constraints on the eventual scale up of the process while still producing films of the highest quality.

Organometallic vapor phase epitaxy (OMVPE) is a technique for growing metal oxide and multicomponent metal oxide films. Film growth by this basic technique is known by various names in addition to OMVPE, including chemical vapor deposition (CVD), vapor phase epitaxy (VPE), metalorganic CVD (MOCVD), and plasma enhanced CVD (PECVD), among others. For clarity, OMVPE will be used throughout the present specification.

OMVPE, similar to the case of MBE, has for several years been used to produce thin films of only moderate quality. Early work was on relatively small area wafers deposited at high temperatures. See, e.g., Yamane, et al., Y-Ba-Cu-O Superconducting Films Prepared On $SrTiO_3$ Substrates By Chemical Vapor Deposition, 53 Appl. Phys. Lett. 1548 (1988). OMVPE has progressed to larger area wafers (three inch) at reduced temperatures. See, e.g., Chern, et al., Epitaxial Thin Films of $YBa_2Cu_3O_{7-\delta}$ on $LaAlO_3$ Substrates Deposited by Plasma-Enhanced Metalorganic Chemical Vapor Deposition, 58 Appl. Phys. Lett. 185 (1991). OMVPE further progressed to the use of novel starting material configurations and even larger area wafers (four inch) for deposition. See, e.g., Hiskes, et al., Single Source Metalorganic Chemical Vapor Deposition Of Low Microwave Surface Resistance $YBa_2Cu_3O_7$, 59 Appl. Phys. Lett. 606 (1991). The difficulty of working with metalorganic precursors, in particular their extremely low vapor pressures and their unpredictable decomposition when held at the elevated temperatures necessary for vapor transport, has plagued all researchers to date, and has limited the quality of the films produced. Thus, despite inherent advantages of the OMVPE process, which include compatibility with oxygen at elevated pressures, ability to scale to very large deposition areas, and ability to produce films virtually free of non growth related defects, to date its application to the deposition of HTS materials has been hindered by the poor chemical properties of the currently available precursor compounds.

The basic OMVPE technique includes flowing a gaseous phase of metal containing compounds in the vicinity of a heated substrate wafer whereby the various gas molecules may contact the surface of the wafer. Upon contact with the heated wafer surface, certain gas molecules react with the surface and decompose into constituent metal atoms and non-metal atoms. The metal atoms become incorporated as a solid phase on the surface (i.e. become the growing film). The non-metal atoms remain in a gaseous phase and may be removed. Various modifications of this general process include operating at different gas pressures, using different types of metal containing compounds, and adding non-thermal energy sources to decompose the metal compounds (e.g. decomposition using laser light, radio frequency or direct current plasmas, flash lamps, and chemically excited or reactive molecular species).

Using OMVPE for growing metal oxide and multicomponent metal oxide films provides a variety of benefits over other methods (e.g. laser ablation). OMVPE allows for the growth of such films on large areas and is scalable (i.e. it can be used to coat multiple wafers at the same time). However, major problems plague researchers in this field. One of the biggest problems is reproducibility, especially for multicomponent metal oxide films. For example, HTS films are complex materials the growth of which must be highly controlled to achieve desirable results such as uniformity within the film and reproducibility of the overall film composition.

Previous attempts to control the composition of the gaseous phase during OMVPE have not been successful and the growth and composition of multicomponent metal oxide films through OMVPE have been neither uniform nor reproducible.

As mentioned previously, mass spectroscopy has been used for closed loop composition measurement and feedback in the MBE growth of HTS compounds. Mass spectroscopy is uniquely suited to the high vacuum environment used in the MBE process. In addition, mass spectroscopy has a very large dynamic range for measuring trace quantities of materials, of particular interest when a source vapor is heavily diluted in a carrier gas. However, its application to OMVPE, which typically operates at considerably higher pressures than MBE is complicated by the need to suitably reduce the pressure in the vicinity of the mass spectrometer head for successful operation. A very simple approach to measuring composition in situ and controlling source fluxes in the OMVPE process for deposition of HTS materials has been developed which incorporates quartz crystal deposition rate monitors. See, e.g., Duray, et al., Pulsed Organometallic Beam Epitaxy of Complex Oxide Films, 59 Appl. Phys. Lett. 1503 (1991). While composition feedback control was demonstrated, the memory effects of the quartz crystal monitors after measurement of several different materials has been performed, and their absolute precision do not appear to be suitable for wide spread application. In addition, the very low growth rates used in the above work avoided the problem of quartz crystal overloading during the deposition process. If a quartz crystal change is required during a deposition run due to build up of material, the recalibration necessary would virtually eliminate possibility of consistent composition measurement and control. During the OMVPE deposition of III–V semiconductor compounds, an ultrasonic composition monitoring and feedback technique has been commercially available and successfully used. See, e.g., Butler, et al., Variations in Trimethylindium Partial Pressure Measured by an Ultrasonic Cell on an MOVPE Reactor, 94 J. Cryst. Growth 481 (1989); and DenBaars, et al., 35 GHz fmax InP JFET Grown by MOCVD Using Tertiarybutylphosphine (TBP), 29 Electronics Lett. 372 (1993). This system, while quite successful at the measurement and control of high volatility metalorganic precursor compounds (e.g., trimethyl gallium) at relatively high pressures ($P \geq 200$ torr), has not been demonstrated for use with the metalorganic compounds required during deposition of the HTS thin films. In particular, it is known that the entire gas delivery system for HTS OMVPE must operate at temperatures above 200° C. and at pressures as low as possible (e.g. 1–100 torr) due to the extreme low volatility of the metalorganic precursor compounds. In all but the most favorable conditions, this would preclude use of the ultrasonic sensors for composition measurement and feedback.

Despite the desirability of the use of OMVPE for growth of high quality metal oxide films, only incomplete success has been achieved to date.

SUMMARY OF INVENTION

The present invention provides an apparatus and methods for the controlled growth of metal oxides and multicomponent metal oxides, including HTS compounds, using OMVPE. The apparatus includes a gas delivery system for control of the gaseous phase by enabling control of the introduction of molecules into the gaseous phase. The apparatus allows for the measurement and feedback of the temperature, flow, and pressure of the gaseous phase. The apparatus is designed specifically to facilitate the use of low volatility precursor compounds. In one preferred embodiment, the apparatus includes a mass spectrograph for compositional analysis of gaseous material.

More particularly, the apparatus comprises a feed-back loop system whereby compositional information regarding the gaseous phase is fed into a controller, such as a computer, which in turn may regulate the pressure, flow, and temperature of the system to achieve a desired composition of the gaseous phase.

Accordingly, it is a principal object of this invention to provide an apparatus and techniques for the controlled growth of metal oxides and multicomponent metal oxides through using OMVPE.

It is a further principal object of this invention to enable uniform growth of films of metal oxides and multicomponent metal oxides.

It is an additional object of this invention to enable reproducible growth of films of metal oxides and multicomponent metal oxides.

DETAILED DESCRIPTION OF THE PREFERRED EMBODIMENT

The methods and apparatus disclosed enable controlled growth of metal oxide and multicomponent metal oxide thin films which are uniform and reproducible. Examples of such multicomponent metal oxide thin films are high temperature superconducting (HTS) thin films.

In general, the present invention comprises a method and apparatus which enable a controlled flow and pressure of a gaseous phase of metal-containing-molecules to be introduced into a reaction chamber (enabling deposition on a substrate and, therefore, growth of a metal oxide or multicomponent metal oxide thin film), or into an analysis chamber (enabling compositional analysis), or into both. The apparatus also allows adjustment of the gaseous phase flow, pressure, and temperature into the reaction chamber based upon the results of the compositional analysis in real time.

To achieve reproducible deposition of multicomponent metal oxide thin films, there must be control over both the composition of the gaseous phase and the decomposition of any material which is the source for the molecules in the gaseous phase. If the composition of the gaseous phase is not controllable, it is not consistently reproducible and any metal oxide or multicomponent metal oxide film grown from that gaseous phase is also not consistently reproducible. Similarly, if there is no control over the decomposition of the materials which are the source for the gaseous phase, then the composition of the gaseous phase is not controlled.

The desirability of controlling the composition of the gaseous phase during OMVPE is of primary importance in maintaining solid phase composition when using low volatility desirability sources. The composition of the gaseous phase must be controllable as a function of time, so growth and composition of the metal oxide film are uniform and reproducible. The methods and apparatus of the present invention enable controlled growth of metal oxide and multicomponent metal oxide thin films which are uniform and reproducible.

Figure 1:
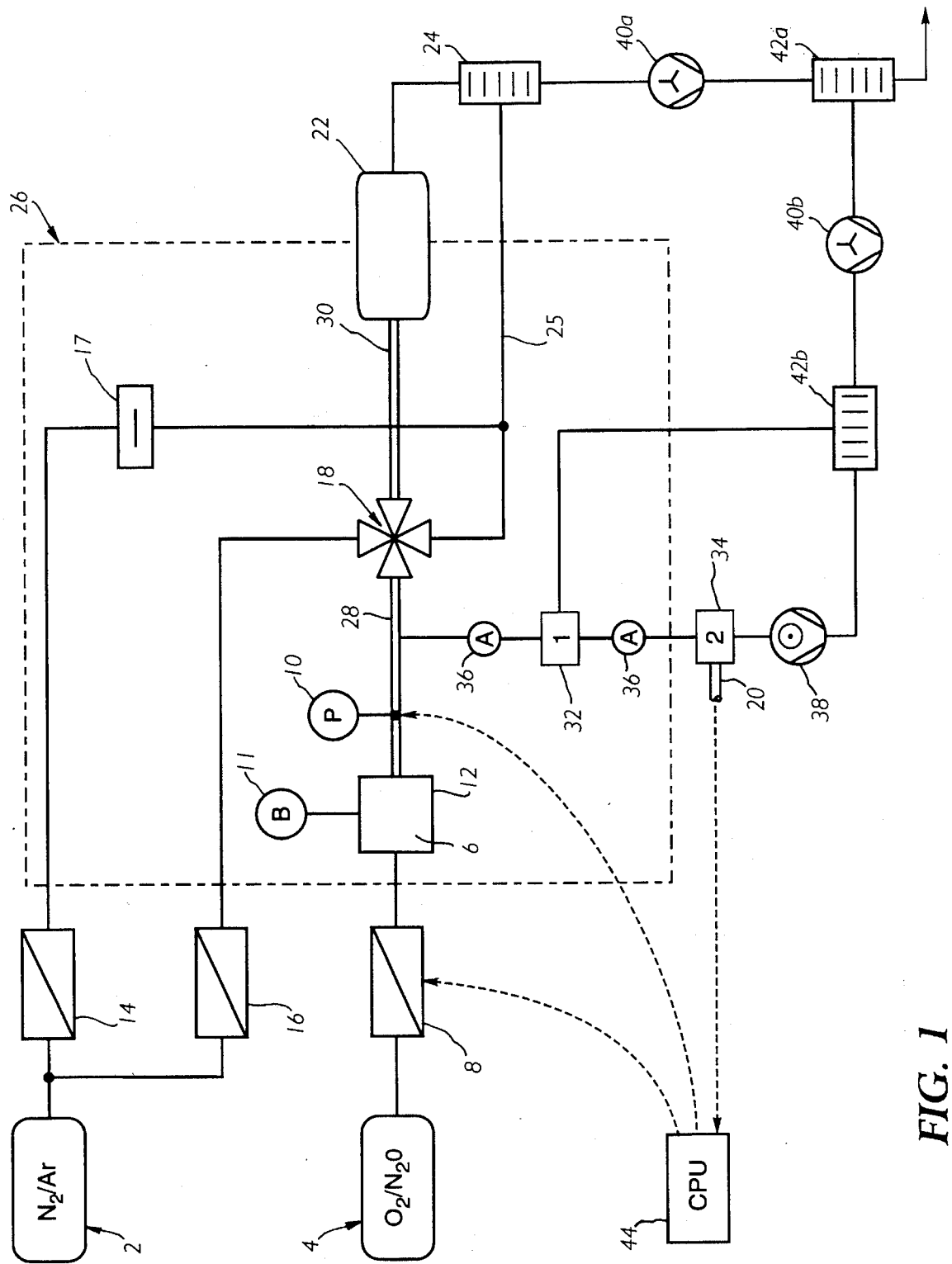
FIG. 1 is a block diagram showing an exemplary apparatus of the present invention.
Figure 2:
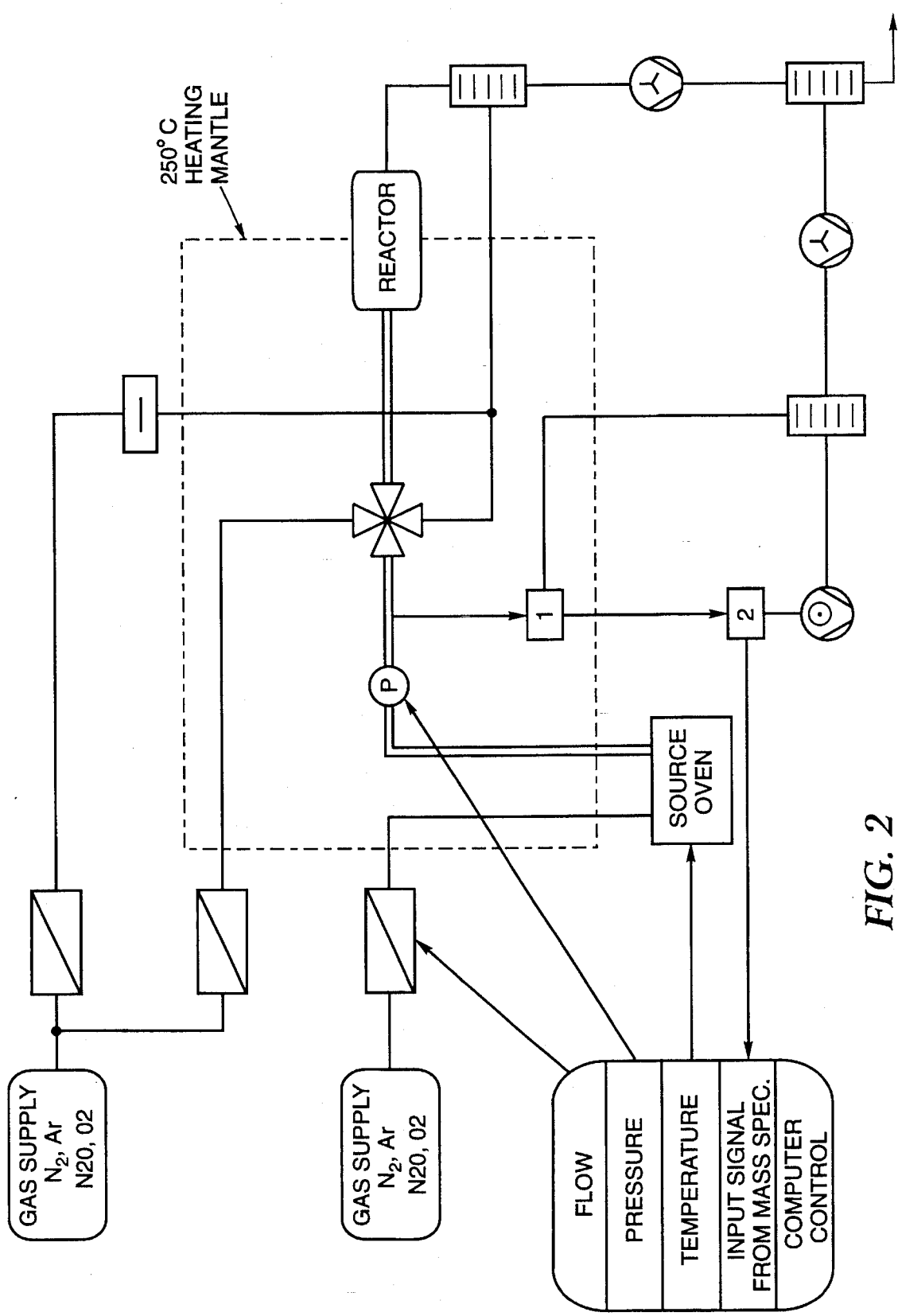
FIG. 2 is a block diagram showing, in general, the overall system of the present invention.

As shown in FIG. 1, the apparatus of the present invention basically comprises an inert gas source 2, an oxidizer source 4, and at least one solid source 6. The solid source 6 has provision for flow control via a solid source mass flow controller 8, for pressure control via a pressure control needle valve 10 and a Baratron pressure controller 11, and for temperature control via a solid source oven 12, all of which may be adjusted during thin film growth. Such adjustment will, generally, be based on the compositional measurements performed in an analysis chamber (described below). It is preferable that the apparatus of the present invention include more than one solid source 6, each with appropriate flow, pressure, and temperature control.

The oxidizer source 4 preferably provides flow of $O_2$ or $N_2O$ gas into the solid source mass flow controller 8. Thus, the flow out of the oxidizer source 4 enables control of the solid source mass flow.

The inert gas source 2 preferably provides flow of $N_2$ or Ar gas. The inert gas flow is preferably split to provide flow through a balance mass flow controller 14 and a vent mass flow controller 16. The balance inert gas flow provides inert gas to the system to enable the system to be pressure balanced between a reactor chamber 22 and vent 24, preferably through the use of a differential Baratron chamber-vent pressure controller 17. The vent inert gas flow provides inert gas to a valve 18 to enable the valve 18 to provide flow balanced switching of inert gas to the vent 24 or to purge the reactor 22.

The solid source 6 preferably provides metal-containing-compounds to be vaporized and carried to a heated substrate wafer for deposition. Preferably metal-containing-compounds include the 2,2,6,6-tetramethyl,3,5-heptanedianato (THD) complexes of yttrium, barium and copper. These metal-containing-compounds are all solids at room temperature and relatively nonvolatile. See Waffenschmidt, et al., 5 J. Sup., No. 2 (1992). The metal-containing-compounds are preferably vaporized at low pressure (about 1–100 torr), elevated temperature (about 100°–250° C.), and high flow rates (about 100–2000 sccm). Once the metal-containing-compounds are vaporized, gas flow from the oxidizer source 4 carries the vaporized compounds to the valve 18, to an analyzer 20 (preferably dual stage mass spectrograph), or both.

The gaseous metal-containing-compounds in the valve 18 may be directed in a flow balanced manner between the vent 24 and the reactor 22. The reactor 22 preferably contains a heated substrate wafer which the gaseous metal compounds may contact and thereby decompose to enable any metal atoms in the compounds to become incorporated as a solid phase on the substrate. The carrier flow may then carry any non-incorporated materials through the scrubber vent 24 and out of the apparatus. Preferably, the apparatus includes a by-pass line 25 enables flow from the valve 18 to by-pass the reactor 22 and flow directly into the scrubber 24 and out of the apparatus.

To enable any gaseous metal-containing-compounds to be carried throughout the apparatus as described above, the apparatus is provided with a heating mantle 26 which preferably enables substantially uniform heating (i.e. ±2° C.) of all lines and components of the apparatus through which gaseous metal-containing-compounds may be carried. The heating mantle 26 prevents any "cold-spot" condensation of the metal-containing-compounds. In addition, as described above, it is preferable that the apparatus be capable of accommodating high flow rates (e.g. about 100–2000 sccm) especially through any piping through which gaseous metal-containing-compounds may flow. Therefore, it is preferable that piping 28 (from the solid source 10 to the valve 18) and piping 30 (from the valve 18 to the reactor 22) have a diameter of about 0.25 to 1.00 inches, with diameters of 0.375 to 1.00 inches being typical.

As shown in FIG. 1, the apparatus preferably includes a dual stage mass spectrometer 20 comprising a first stage chamber 32 (which is preferably within the heating mantle 26) and a second stage chamber 34 (which is preferably not within the heating mantle 26). Preceding each of the chambers 32 and 34 is, preferably, a 1000:1 aperture 36, which will suitably reduce the pressure from 1–100 torr in the gas line 28 to approximately $10^{-6}$ torr in the second stage chamber 34. The mass spectrometer head resides in chamber 34. The mass spectrometer 20 preferably provides compositional analysis of the gaseous phase to a control source 44. The control source is also provided with information regarding the flow, pressure, and temperature of the overall system and may be used to adjust the flow, pressure, temperature, or any combination, as indicated by the compositional analysis provided by the mass spectrometer 20.

Also shown in FIG. 1, the apparatus preferably includes a turbo molecular pump 38 and two rotary vane pumps 40a and 40b. The pumps 38 and 40b enable the mass spectrometer 20 to operate at low pressures (e.g. preferably between $10^{-5}$–$10^{-6}$ torr). In addition, pump 40a draws gas flow from the main system through scrubbers 24 and 42a and b which clean the gas before it exits the system.

In another embodiment of the present invention, the apparatus includes several solid sources 6. Each solid source 6 flows into a manifold (not shown) which enables flow control to the mass spectrometer 20 such that separate analysis of individual precursor molecules may be accomplished. The manifold would enable the selection of gas to be analyzed. For example, the gas from each solid source may be analyzed separately or in any combination.

Although embodiments of the present invention have been shown and described, various modifications may be made without departing from the scope of the present invention, and all such modifications and equivalents are intended to be covered.

We claim:

1. An apparatus for enabling composition controlled deposition of multicomponent metal oxide film on a substrate comprising:

more than one solid source each for holding a solid metal-containing compound and including a gas flow controller, a temperature controller, and a pressure controller, for providing controlled vaporization of the solid metal-containing compound into a gaseous phase and for enabling flow of the gaseous phase to at least one of a reaction chamber and a composition analyzer, the reaction chamber for holding a heated substrate and accepting gas flow of the gaseous phase, the heated substrate enabling decomposition of the gaseous phase and deposition of the metal in the gaseous phase onto the substrate, a gaseous phase composition analyzer for accepting gas flow of the gaseous phase and analyzing the composition of the gaseous phase, and a controller for receiving information regarding the composition of the gaseous phase from the composition analyzer and for controlling the composition of the gaseous phase through adjusting at least one of the gas flow controller, the temperature controller, and the pressure controller of the solid sources.

2. The apparatus claimed in claim 1 wherein the analyzer for accepting gas flow comprises a mass spectrometer.

3. The apparatus of claim 1 further comprising a heating enclosure which uniformly heats and controls the temperature of all process piping downstream from the solid sources to prevent precursor condensation prior to reaching the reaction chamber.

4. An apparatus of claim 1 further comprising closed-loop real time adjustment of gas composition in the reaction chamber to maintain metal oxide film composition.

5. The apparatus of claim 1 wherein the vaporization of the solid metal-containing compound occurs at a pressure of about 1–100 torr, at a temperature of about 100°–200° C., and at a gaseous flow rate of about 100–2000 sccm.

6. The apparatus of claim 5 wherein the gaseous phase composition analyzer is operatively connected to accept gas flow of gaseous phase prior to entry into the reaction chamber.

\* \* \* \* \*

UNITED STATES PATENT AND TRADEMARK OFFICE
CERTIFICATE OF CORRECTION

PATENT NO.  : 5,458,086
DATED       : October 17, 1995
INVENTOR(S) : Eric J. Smith et al.

It is certified that error appears in the above-indentified patent and that said Letters Patent is hereby corrected as shown below:

Column 2, Line 23, delete "$YBa_2Cu_3, O_{7-\delta}$" and insert therefor -- $YBa_2Cu_3O_{7-\delta}$ --; and Column 5, Line 56, delete "desirability" and insert therefor -- metalorganic --.

Signed and Sealed this

Twenty-seventh Day of February, 1996

Attest:

BRUCE LEHMAN

*Attesting Officer*          *Commissioner of Patents and Trademarks*